(12) United States Patent
Jia et al.

(10) Patent No.: US 11,575,107 B2
(45) Date of Patent: Feb. 7, 2023

(54) PACKAGING STRUCTURE, PACKAGING METHOD AND DISPLAY APPARATUS

(71) Applicants: HEFEI BOE JOINT TECHNOLOGY CO., LTD., Anhui (CN); BOE TECHNOLOGY GROUP CO., LTD., Bejing (CN)

(72) Inventors: Wenbin Jia, Beijing (CN); Xinwei Gao, Beijing (CN); Peng Li, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 116 days.

(21) Appl. No.: 17/256,085

(22) PCT Filed: Apr. 17, 2020

(86) PCT No.: PCT/CN2020/085315
§ 371 (c)(1),
(2) Date: Dec. 24, 2020

(87) PCT Pub. No.: WO2020/233298
PCT Pub. Date: Nov. 26, 2020

(65) Prior Publication Data
US 2021/0226150 A1    Jul. 22, 2021

(30) Foreign Application Priority Data
May 22, 2019    (CN) .......................... 201910431420.8

(51) Int. Cl.
*H01L 51/52*    (2006.01)
*H01L 51/56*    (2006.01)

(52) U.S. Cl.
CPC ............ *H01L 51/525* (2013.01); *H01L 51/56* (2013.01)

(58) Field of Classification Search
None
See application file for complete search history.

(56) References Cited

U.S. PATENT DOCUMENTS

2015/0008819 A1    1/2015    Yu
2016/0181230 A1    6/2016    Li
(Continued)

FOREIGN PATENT DOCUMENTS

CN    101692446 A    4/2010
CN    104576698 A    4/2015
(Continued)

OTHER PUBLICATIONS

First office action of Chinese application No. 201910431420.8 dated Nov. 3, 2020.
(Continued)

*Primary Examiner* — Michelle Mandala
(74) *Attorney, Agent, or Firm* — Fay Sharpe LLP

(57) ABSTRACT

A packaging structure, a packaging method, and a display apparatus are disclosed. The packaging structure includes: a first substrate and a second substrate opposite to each other; a plurality of first sealing frames located between the first substrate and the second substrate, wherein the first substrate, the second substrate and the plurality of first sealing frames enclose a plurality of sealed cavities not communicating with each other, and each of the sealed cavities is configured to package at least one to-be-packaged unit of a to-be-packaged device; and a first filler located in the sealed cavity.

15 Claims, 12 Drawing Sheets

(56) References Cited

U.S. PATENT DOCUMENTS

2019/0103584 A1* 4/2019 Chen .................. H01L 51/5246
2021/0226605 A1* 7/2021 Schieber ............ H03H 9/02913

FOREIGN PATENT DOCUMENTS

CN    106848099 A    6/2017
CN    110112314 A    8/2019

OTHER PUBLICATIONS

Notification to grant patent for invention of Chinese application No. 201910431420.8 dated May 27, 2021.

* cited by examiner

PACKAGING STRUCTURE, PACKAGING METHOD AND DISPLAY APPARATUS

CROSS-REFERENCE TO RELATED APPLICATIONS

This application is a 371 of PCT Application No. PCT/CN2020/085315 filed on Apr. 17, 2020, which claims priority to Chinese Patent Application No. 201910431420.8, filed on May 22, 2019 and entitled "PACKAGING STRUCTURE, PACKAGING METHOD, AND DISPLAY APPARATUS", which is incorporated herein by reference in its entirety.

TECHNICAL FIELD

The present disclosure relates to a packaging structure, a packaging method, and a display apparatus.

BACKGROUND

Due to characteristics of self-luminescence, fast response, wide viewing angles, high brightness, bright colors and thinness, organic light emitting diode (OLED) display apparatuses find wide applications in the field of display technologies. The OLED display apparatus can realize the display function by means of light emitted from the OLED devices therein. As the OLED devices may easily be eroded by oxygen, moisture or other substances in the air, it is necessary to provide a packaging structure to isolate the OLED devices from the air.

SUMMARY

The embodiments of the present disclosure provide a packaging structure, a packaging method, and a display apparatus. The technical solutions are as follows.

According to a first aspect, a packaging structure is provided, including:

a first substrate and a second substrate opposite to each other;

a plurality of first sealing frames between the first substrate and the second substrate, wherein the first substrate, the second substrate and the plurality of first sealing frames enclose a plurality of sealed cavities not communicating with one another, and each of the sealed cavities is configured to package at least one to-be-packaged unit of a to-be-packaged device; and a first filler in the sealed cavities.

Optionally, the plurality of first sealing frames are arranged in arrays to form a plurality of rows, and any two adjacent first sealing frames located in a same row share a common frame edge.

Optionally, the plurality of first sealing frames are arranged in arrays to form a plurality of columns, and any two adjacent first sealing frames located in a same column share a common frame edge.

Optionally, any two adjacent first sealing frames of the plurality of first sealing frames share a common frame edge.

Optionally, the plurality of first sealing frames are spaced apart from one another.

Optionally, a material of the first sealing frames is an elastic material.

Optionally, the packaging structure further includes:

a second sealing frame between the first substrate and the second substrate, wherein the plurality of first sealing frames are located inside the second sealing frame.

Optionally, the packaging structure further includes:

a second filler between the second sealing frame and the first sealing frames.

Optionally, the first substrate has a display region and a non-display region, the first sealing frames are located in the display region and the second sealing frame is located in the non-display region.

Optionally, the to-be-packaged unit is a light emitting unit, each of the sealed cavities is configured to package a plurality of to-be-packaged units of the to-be-packaged device, and the plurality of the to-be-packaged units packaged in a same sealed cavity emit light with different colors.

According to a second aspect, a packaging method is provided, including:

providing a first substrate and a second substrate; and pairing the first substrate and the second substrate to be opposite to each other to dispose a plurality of first sealing frames between the first substrate and the second substrate, so that the first substrate, the second substrate and the plurality of first sealing frames enclose a plurality of sealed cavities not communicating with one another, each of the sealed cavities is configured to package at least one to-be-packaged unit of a to-be-packaged device, and the sealed cavity is filled with a first filler.

Optionally, said pairing the first substrate and the second substrate to be opposite to each other to dispose a plurality of first sealing frames between the first substrate and the second substrate, so that the first substrate, the second substrate and the plurality of first sealing frames enclose a plurality of sealed cavities not communicating with one another, each of the sealed cavities is configured to package at least one to-be-packaged unit of a to-be-packaged device, and the sealed cavity is filled with a first filler includes:

forming the plurality of first sealing frames on the first substrate, wherein a height of the first sealing frame is greater than or equal to a preset height;

forming a first filling adhesive on the first substrate at regions enclosed by the first sealing frames;

pairing the first substrate and the second substrate formed with the to-be-packaged device to be opposite to each other, so that the height of the first sealing frame is equal to a distance between the first substrate and the second substrate, the plurality of first sealing frames, the first filling adhesive and the to-be-packaged device are located between the first substrate and the second substrate, the first substrate, the second substrate and the plurality of first sealing frames enclose the plurality of sealed cavities not communicating with one another, each of the sealed cavities is configured to package at least one to-be-packaged unit, and each of the sealed cavities is filled with the first filling adhesive; and curing the first filling adhesive to obtain the first filler.

Optionally, prior to pairing the first substrate and the second substrate formed with the to-be-packaged device to be opposite to each other, the method further includes:

forming a second sealing frame on the first substrate, wherein the plurality of first sealing frames are located in the second sealing frame; and forming a second filling adhesive on the first substrate at regions located between the second sealing frame and the first sealing frames.

After pairing the first substrate and the second substrate formed with the to-be-packaged device to be opposite to each other, the method further includes:

curing the second filling adhesive to obtain a second filler.

Optionally, said forming a first filling adhesive on the first substrate at regions enclosed by the first sealing frames includes:

forming the first filling adhesive on the first substrate at regions enclosed by the first sealing frames by a dispensing process.

Said forming a second filling adhesive on the first substrate at regions located between the second sealing frame and the first sealing frame includes:

forming the second filling adhesive on the first substrate at regions located between the second sealing frame and the first sealing frames by a dispensing process, wherein an amount of one drop of the second filling adhesive is greater than an amount of one drop of the first filling adhesive.

Optionally, prior to forming the plurality of first sealing frames on the first substrate, the method further includes:

determining a number of packaged units to be packaged in a first sealing frame to be formed based on a dispersed area of one drop of the first filling adhesive; and determining an area of the first sealing frame to be formed based on the number of the packaged units to be packaged in the first sealing frame to be formed.

Said forming the plurality of first sealing frames on the first substrate includes:

forming the plurality of first sealing frames on the first substrate according to the area of the first sealing frame to be formed.

Optionally, said forming the plurality of first sealing frames on the first substrate includes:

forming the plurality of first sealing frames on the first substrate by using an elastic material.

According to a third aspect, a display apparatus is provided, which includes a display device and the packaging structure according to the first aspect or any optional manner of the first aspect.

Optionally, the to-be-packaged unit is a light emitting unit of the display device, each of the sealed cavities packages a plurality of light emitting units of the display device, and the plurality of light emitting units packaged in a same sealed cavity include a red light emitting unit, a green light emitting unit, and a blue light emitting unit.

Optionally, the display device further includes a driving unit electrically connected to the light emitting units; and the packaging structure further includes the second sealing frame between the first substrate and the second substrate, and the plurality of first sealing frames and the driving unit are located in the second sealing frame.

Optionally, the display device is an OLED device or a quantum dot light emitting diode (QLED) device; and correspondingly, the light emitting unit is an OLED unit or a QLED unit.

BRIEF DESCRIPTION OF DRAWINGS

To describe the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

The drawings herein are incorporated in and constitute a part of the specification. They show some embodiments consistent with the present disclosure and are used in conjunction with the specification to explain the principles of the present disclosure.

DESCRIPTION OF EMBODIMENTS

The present disclosure will be described in detail below with reference to drawings. It is obvious that the described embodiments are only a part of embodiments of the present disclosure, not all embodiments of the present disclosure. All the other embodiments achieved by those of ordinary skills in the art, based on the embodiments of the present disclosure without creative work, shall fall within the protection scope of the present disclosure.

Figure 1:
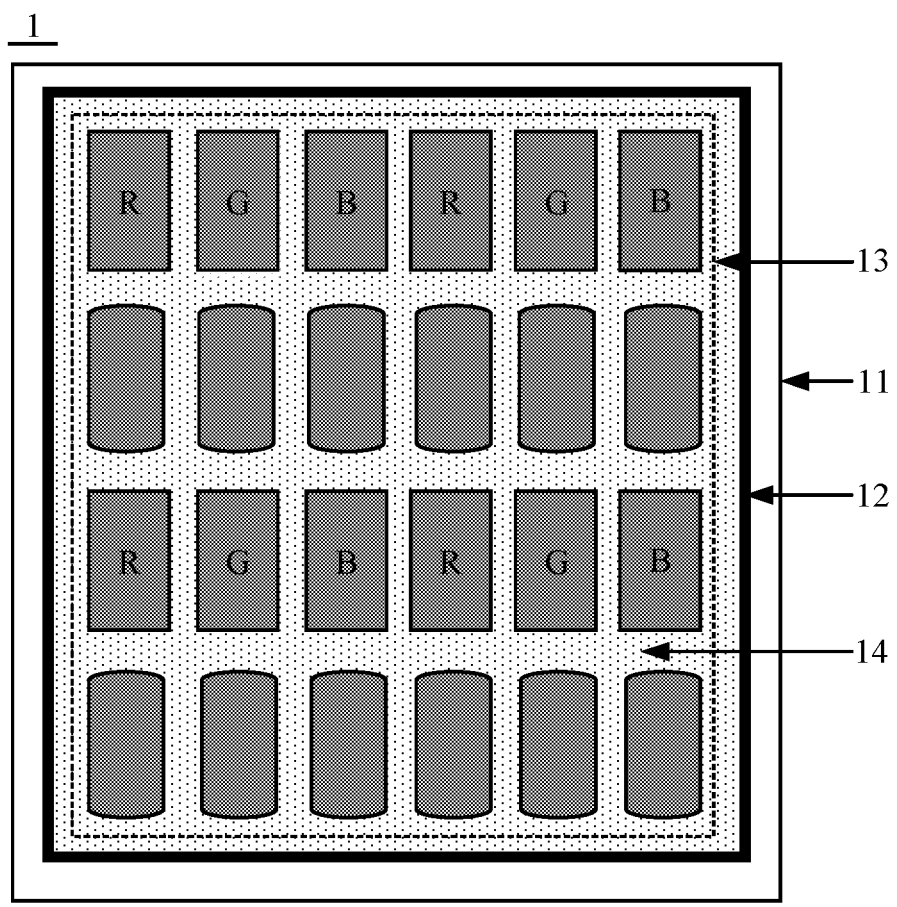
FIG. 1 is an application scenario diagram of a packaging structure involved in an embodiment of the present disclosure.

The OLED device may easily be eroded by oxygen, moisture, or other substances in the air. Thus, a packaging structure is generally adopted in the OLED display apparatus to isolate the OLED device from the air. With reference to FIG. 1 which shows an application scenario diagram of a packaging structure 1 involved in an embodiment of the present disclosure, the packaging structure 1 includes: a base substrate 11 and a package cover plate (not shown in FIG. 1) that are opposite to each other, and a sealing frame 12 located between the base substrate 11 and the package cover plate. The base substrate 11, the package cover plate and the sealing frame 12 enclose a sealed cavity in which an OLED device 13 is located. The packaging structure 1 further includes a filler 14 located in the sealed cavity. When packaging the OLED device 13, a frame sealing adhesive is firstly coated on the package cover plate and then cured to obtain the sealing frame 12. Subsequently, a filling adhesive is dispensed on the package cover plate at the regions inside the sealing frame 12 by a dispensing process, and then the package cover plate is placed opposite to the base substrate 11 on which the OLED device 13 has been provided, so that the sealing frame 12, the filling adhesive and the OLED device 13 are located between the package cover plate and the base substrate 11, and the OLED device 13 is located inside the sealing frames 12. Finally, the package cover plate is press-fitted with the base substrate 11, and the filling adhesive is cured to obtain the filler 14, thereby completing the package of the OLED device 13.

However, due to errors in the dispensing process, there is a difference between the amount of the filling adhesive dispensed inside the sealing frame 12 and the amount actually required, which results in a poor dispersed effect of the filling adhesive during the process of press-fitting the package cover plate with the base substrate 11, thereby causing the packaging structure 1 to have a poor package effect. The poor dispersed effect of the filling adhesive may also cause the packaging structure 1 to have a poor packaging reliability and cause the OLED display apparatus to have a poor luminescence uniformity, which may further lead to problems of light leakage and color shift in the OLED display apparatus. Regarding the poor dispersed effect of the filling adhesive, it may be, for example, that the filling adhesive may overflow from the sealing frame 12 during the press-fitting process when the total amount of the filling adhesive is too much; or bubbles may appear in the filling adhesive during the press-fitting process when the total amount of the filling adhesive is too little, or the filling of the filling adhesive is uneven if different drops of the filling adhesive are different in amount during the process of dispensing the filling adhesive.

The embodiments of the present disclosure provide a packaging structure, a packaging method, and a display apparatus. The packaging structure includes: a first substrate and a second substrate opposite to each other; a plurality of first sealing frames between the first substrate and the second substrate, wherein the first substrate, the second substrate and the plurality of first sealing frames enclose a plurality of sealed cavities not communicating with one another, and each of the sealed cavities is configured to package at least one to-be-packaged unit of a to-be-packaged device; and a first filler in the sealed cavities. As the plurality of sealed cavities do not communicate with one another, the first filler in the plurality of sealed cavities would not affect one another, which is beneficial in improving the filling effect of the fillers, thereby improving the package effect of the packaging structure.

Figure 2:
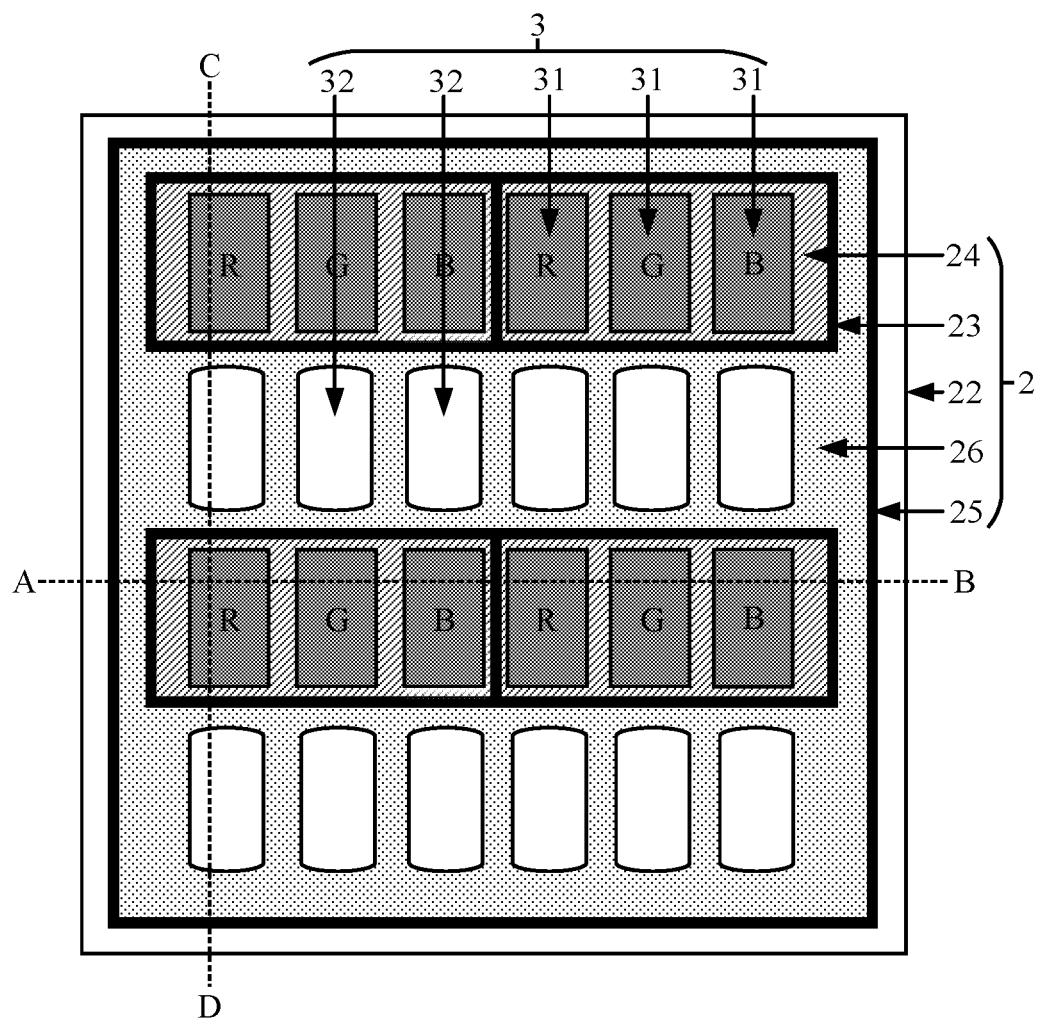
FIG. 2 is an application scenario diagram of a packaging structure according to an embodiment of the present disclosure.
Figure 3:
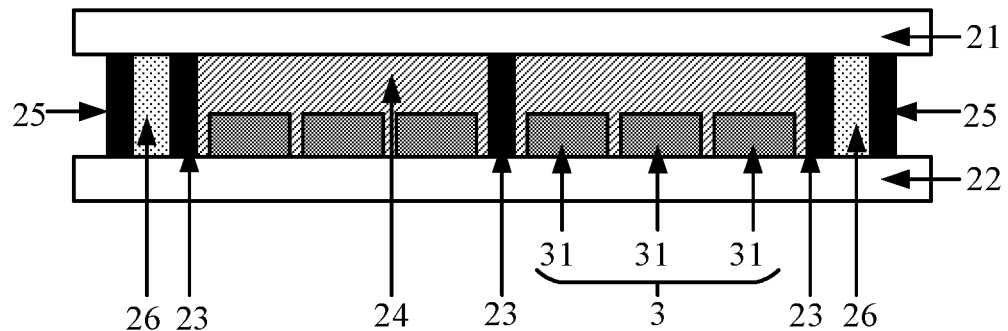
FIG. 3 is a schematic sectional view of FIG. 2 at A-B position.
Figure 4:
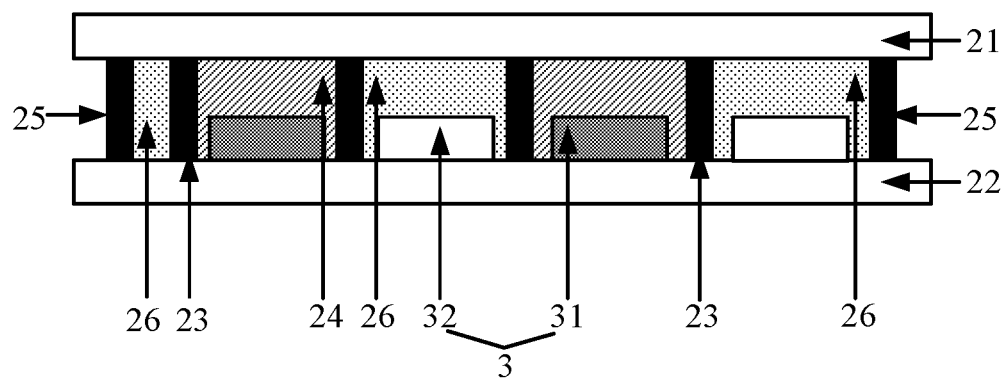
FIG. 4 is a schematic sectional view of FIG. 2 at C-D position.

FIG. 2 is an application scenario diagram of a packaging structure 2 according to an embodiment of the present disclosure; FIG. 3 is a schematic sectional view of FIG. 2 at A-B position; and FIG. 4 is a schematic sectional view of FIG. 2 at C-D position. With reference to FIG. 2 to FIG. 4, the packaging structure 2 includes:

a first substrate 21 and a second substrate 22 opposite to each other;

a plurality of first sealing frames 23 (four sealing frames are shown in FIG. 2) between the first substrate 21 and the second substrate 22, wherein the first substrate 21, the second substrate 22 and the plurality of first sealing frames 23 enclose a plurality of sealed cavities (not marked in FIG. 2 to FIG. 4) not communicating with one another, and each of the sealed cavities is configured to package at least one to-be-packaged unit 31 (three to-be-packaged units are shown in FIG. 2 and FIG. 3) of a to-be-packaged device 3; and a first filler 24 in the sealed cavities.

In the embodiment of the present disclosure, the first filler 24 is generally formed by dispensing a first filling adhesive in the first sealing frames 23, press-fitting the first substrate 21 with the second substrate 22, and then curing the first filling adhesive. As the plurality of sealed cavities enclosed by the first substrate 21, the second substrate 22 and the plurality of first sealing frames 23 do not communicate with one another, the first filler 24 in the plurality of sealed cavities would not affect one another. Thus, even if the filling of the first filler 24 in a certain sealed cavity is uneven, the filling effect of the first filler 24 in other sealed cavities will not be affected, which is beneficial in improving the overall filling effect of the fillers. Moreover, in the embodiment of the present disclosure, the plurality of first sealing frames 23 can extend the penetration paths of moisture and oxygen, which is beneficial in improving the barrier effect of the packaging structure 2 against moisture and oxygen, thereby improving the package effect of the packaging structure 2.

In summary, in the packaging structure provided by the embodiment of the present disclosure, as the plurality of sealed cavities enclosed by the first substrate, the second substrate and the plurality of first sealing frames in the packaging structure do not communicate with one another, the first filler in the plurality of sealed cavities would not affect one another. Thus, even if the filling of a first filler in a certain sealed cavity is uneven, the filling effect of the first filler in other sealed cavities would not be affected, which is beneficial in improving the overall filling effect of the fillers, thereby improving the package effect of the packaging structure.

Figure 5:
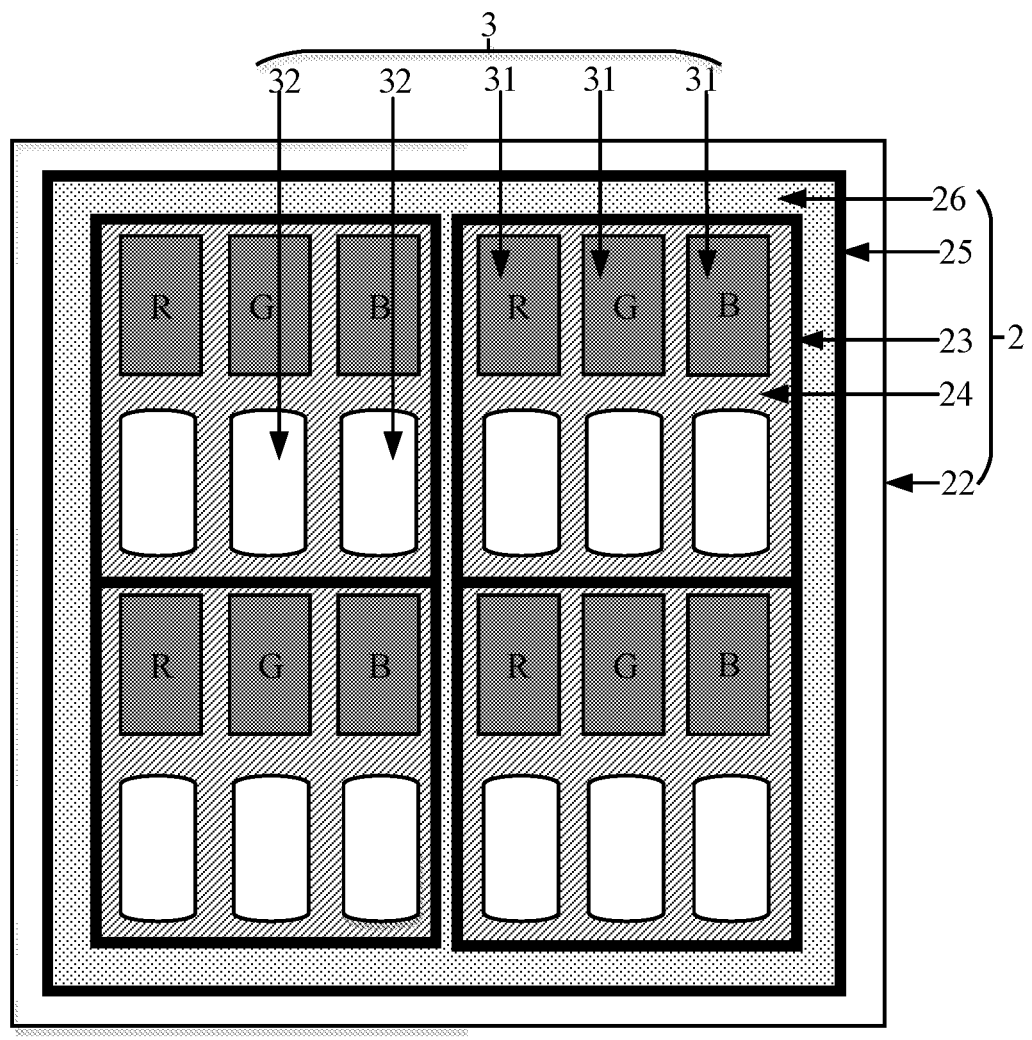
FIG. 5 is an application scenario diagram of another packaging structure according to an embodiment of the present disclosure.
Figure 6:
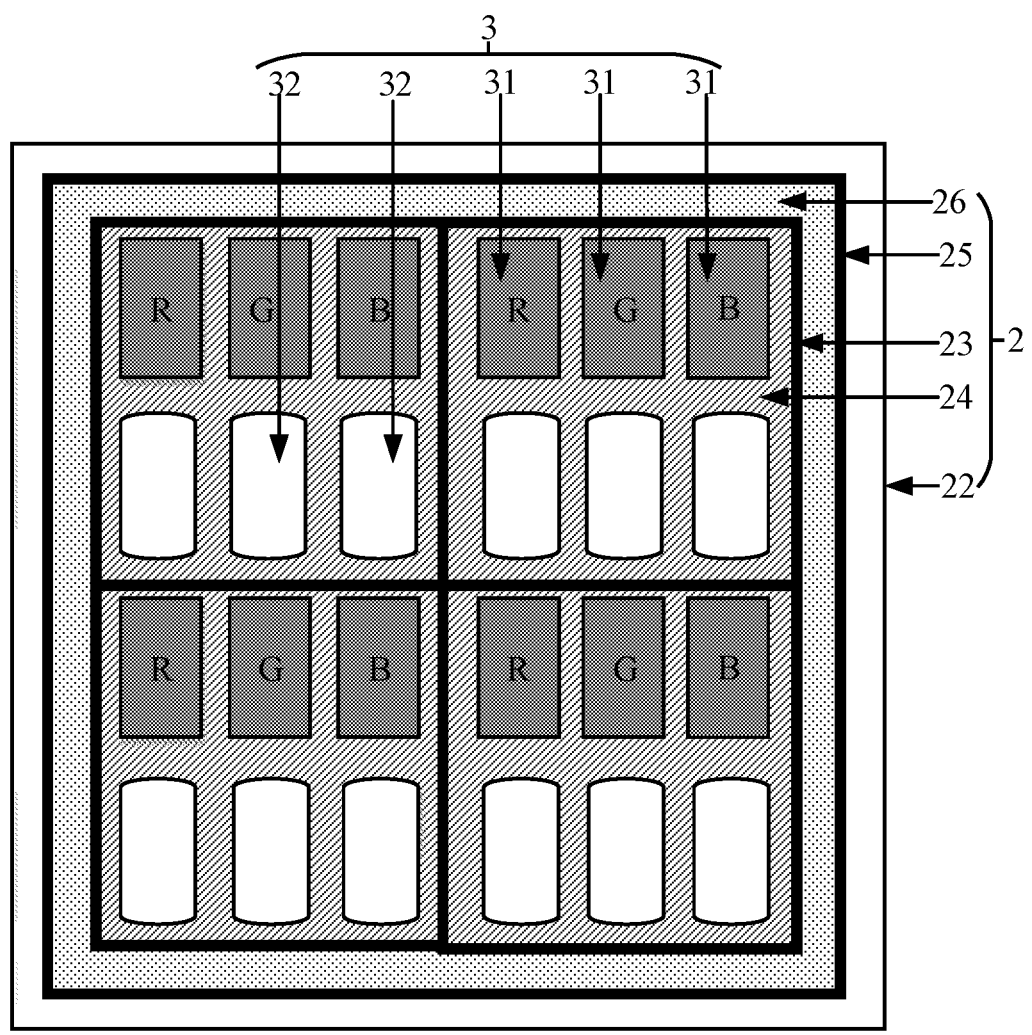
FIG. 6 is an application scenario diagram of still another packaging structure according to an embodiment of the present disclosure.
Figure 7:
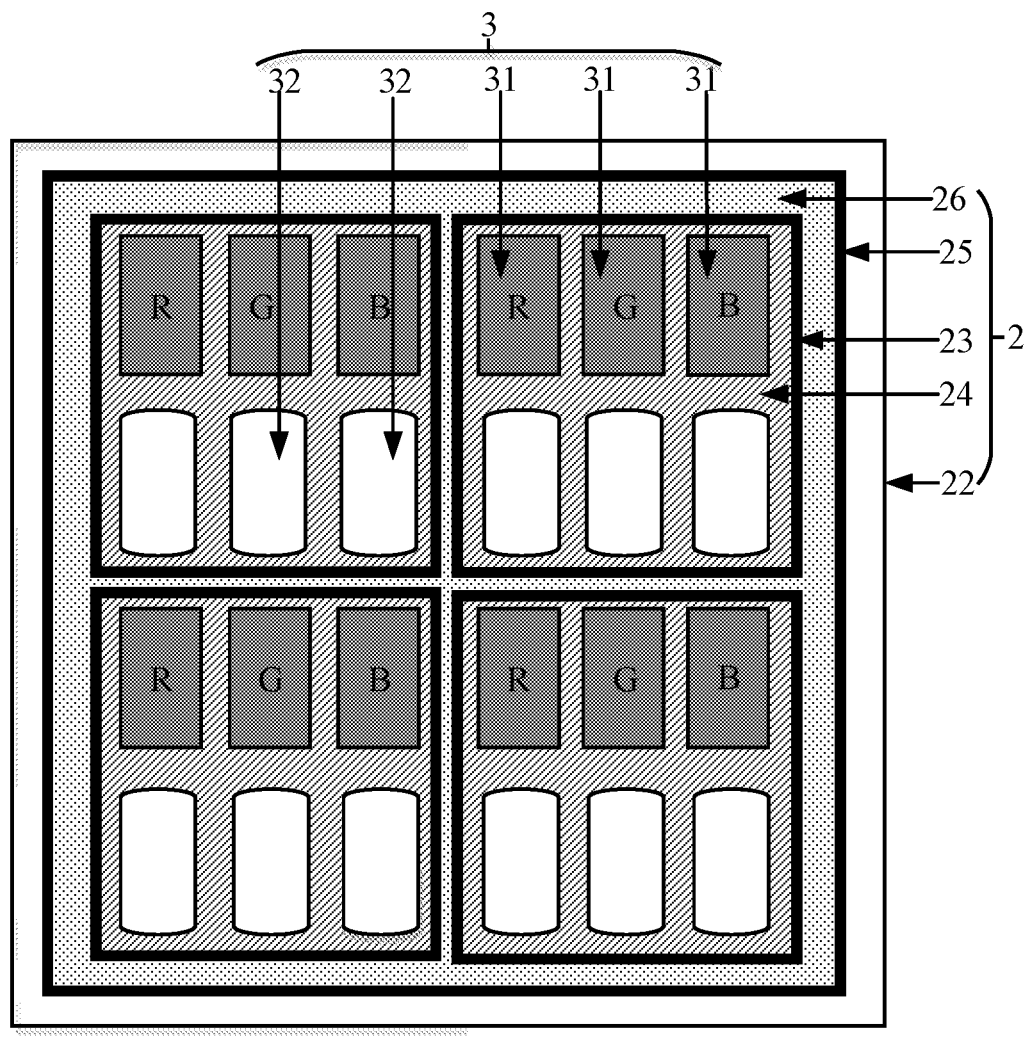
FIG. 7 is an application scenario diagram of yet another packaging structure according to an embodiment of the present disclosure.

Optionally, in the embodiment of the present disclosure, the adjacent first sealing frames of the plurality of first sealing frames may share a common frame edge, or the plurality of first sealing frames are spaced apart from one another. Exemplarily, the plurality of first sealing frames are arranged in arrays to form a plurality of rows, and any two adjacent first sealing frames located in a same row share a common frame edge. Alternatively, the plurality of first sealing frames are arranged in arrays to form a plurality of columns, and any two adjacent first sealing frames located in a same column share a common frame edge. Alternatively, any adjacent first sealing frames of the plurality of first sealing frames share a common frame edge. Alternatively, a gap exists between any two adjacent first sealing frames of the plurality of first sealing frames (that is, the plurality of first sealing frames are arranged at intervals). Exemplarily, the first sealing frames 23 may be rectangular. As shown in FIG. 2, the plurality of first sealing frames 23 are arranged in arrays to form a plurality of rows, and any two adjacent first sealing frames 23 located in the same row share a common frame edge. As shown in FIG. 5, the plurality of first sealing frames 23 are arranged in arrays to form a plurality of columns, and any two adjacent first sealing frames 23 located in the same column share a common frame edge. As shown in FIG. 6, any adjacent first sealing frames 23 of the plurality of first sealing frames 23 share a common frame edge. As shown in FIG. 7, a gap exists between any two adjacent first sealing frames 23 of the plurality of first sealing frames 23. In the embodiment of the present disclosure, when the to-be-packaged device 3 is a display device, a row direction of the plurality of rows formed by the plurality of first sealing frames 23 arranged in arrays may be parallel to a scanning direction of gate lines, and a column direction of the plurality of columns formed by the plurality of first sealing frames 23 arranged in arrays may be parallel to a scanning direction of data lines. It will be easily appreciated by one skilled in the art that the first sealing frames 23 shown in FIG. 2 and FIGS. 5 to 7 are only exemplary. In practical applications, the first sealing frames 23 may be formed in other shapes, and reference may be made to FIG. 3 and FIG. 4 for schematic sectional views of FIG. 5 to FIG. 7, which will not be repeated in this embodiment of the present disclosure.

Optionally, as shown in FIG. 2 to FIG. 7, the packaging structure 2 further includes a second sealing frame 25 between the first substrate 21 and the second substrate 22, and the plurality of first sealing frames 23 are located inside the second sealing frame 25. The packaging structure 2 further includes a second filler 26 between the second sealing frame 25 and the first sealing frames 23. That is, the second filler 26 is located inside the second sealing frame 25 and outside the first sealing frames 23. It will be easily appreciated by one skilled in the art that the moisture and oxygen in the air generally enter the packaging structure 2 from a side surface of the packaging structure 2. Thus, the second sealing frame 25 and the second filler 26 can block the moisture and oxygen in the air before they arrive at the first sealing frames 23, which is beneficial in reducing the amount of moisture and oxygen arriving at the first sealing frames 23, thereby improving the package effect of the packaging structure 2.

Optionally, the to-be-packaged device 3 may be a display device, the second substrate 22 may be a base substrate of the to-be-packaged device 3, and the first substrate 21 may be a package cover plate. The first substrate 21 and the second substrate 22 have a display region (not shown in FIG. 2 to FIG. 7) and a non-display region (not shown in FIG. 2 to FIG. 7), respectively. An orthographic projection of the display region of the first substrate 21 onto the second substrate 22 may coincide with the display region of the second substrate 22, and an orthographic projection of the non-display region of the first substrate 21 onto the second substrate 22 may coincide with the non-display region of the second substrate 22. The to-be-packaged device 3 may be located within the display region of the second substrate 22, the first sealing frames 23 may be located within the display region of the first substrate 21, and the second sealing frame 25 may be located in the non-display region of the first substrate 21.

Optionally, a material of the first sealing frames 23 may be an elastic material. Thus, the first sealing frames 23 have a certain degree of elasticity. Under the elastic force of the first sealing frames 23, the first sealing frames 23 can abut against the second substrate 22, which enables the first sealing frames 23 to be in close contact with the first substrate 21 and the second substrate 22, thereby facilitating to ensure the package effect of the packaging structure 2. Exemplarily, the material of the first sealing frames 23 may be an elastic resin or a thermoplastic elastomer (TPE). The elastic resin may include a resin matrix and an elastic resin spacer doped in the resin matrix. The TPE is also referred to as artificial rubber or synthetic rubber, and may be, for example, polystyrene materials, polyurethane materials, or polyamide materials, etc. The material of the second sealing frame 25 may be a frame sealing adhesive. For example, the frame sealing adhesive may include an epoxy resin and a resin spacer that controls a distance between the first substrate 21 and the second substrate 22. The epoxy resin herein may be any of a light curing epoxy resin or a thermal curing epoxy resin. The materials of the first filler 24 and the second filler 26 may be a filling adhesive. For example, the filling adhesive may be any of a light curing epoxy resin or a thermal curing epoxy resin.

Optionally, the to-be-packaged device 3 may be a display device, and the to-be-packaged unit 31 may be a light emitting unit. Each of the sealed cavities is configured to package a plurality of to-be-packaged units 31 of the to-be-packaged device 3, and the plurality of the to-be-packaged units 31 packaged in a same sealed cavity emit light with different colors. Exemplarily, as shown in FIG. 2 to FIG. 7, the plurality of the to-be-packaged units 31 packaged in a same sealed cavity include a red light emitting unit, a green light emitting unit, and a blue light emitting unit. The red light emitting unit is configured to emit red light, the green light emitting unit is configured to emit green light, and the blue light emitting unit is configured to emit blue light. As the plurality of sealed cavities do not communicate with one another, the light emitting units packaged in the plurality of sealed cavities would not affect one another. Thus, when the filling effect of the first filler 24 in a certain sealed cavity is poor and affects the luminescence effect of the light emitting unit packaged in the sealed cavity, as the filling effect of the first filler 24 packaged in other sealed cavities would not be affected by the first filler 24 packaged in this sealed cavity, the luminescence effect of the light emitting units packaged in the sealed cavity will not be affected as well, which is beneficial in improving the overall luminescence uniformity of the display device formed by using the packaging structure 2 to package the to-be-packaged device 3, thereby ensuring the overall display effect of the display apparatus.

Optionally, when the to-be-packaged unit 31 is a light emitting unit, as shown in FIG. 2 to FIG. 7, the to-be-packaged device 3 further includes driving units 32 electrically connected to the to-be-packaged units 31, and the driving units 32 are configured to drive the to-be-packaged units 31 to emit light. As shown in FIG. 2 to FIG. 4, the driving units 32 are located inside the second sealing frame 25 and outside the first sealing frames 23, and the second filler 26 covers the driving units 32. Alternatively, as shown in FIG. 5 to FIG. 7, the driving units 32 are located inside the second sealing frame 25 and also inside the first sealing frames 23, and the first filler 24 covers the driving units 32. Exemplarily, the to-be-packaged device 3 includes a plurality of driving units 32 electrically connected to the plurality of to-be-packaged units 31 in a one-to-one correspondence, and each of the driving units 32 is configured to drive the corresponding to-be-packaged unit 31 to emit light. The driving unit 32 may be a switching unit, for example, a thin film transistor (TFT).

It will be easily appreciated by one skilled in the art that the relative positions of the driving units 32 and the to-be-packaged units 31 shown in FIG. 2 and FIG. 5 to FIG. 7 are merely exemplary. In practical applications, the driving units 32 may be located below the to-be-packaged units 31 (that is, between the to-be-packaged units 31 and the second substrate 22), and the to-be-packaged units 31 may at least partially cover the driving units 32. For example, when the to-be-packaged device 3 is a top emitting device, the to-be-packaged units 31 may cover 80% of the region of the driving units 32. The embodiment of the present disclosure does not limit the distribution manner of the driving units 32 and the to-be-packaged units 31.

In the embodiment of the present disclosure, the first substrate 21 and the second substrate 22 may be rigid substrates made of light-guiding and non-metallic materials with a certain degree of robustness, such as glass, quartz, or transparent resin. The to-be-packaged device 3 may be an electroluminescence (EL) device, and correspondingly, the to-be-packaged units 31 may be EL units. For example, the to-be-packaged device 3 may be an OLED device or a QLED device, and correspondingly, the to-be-packaged units 31 may be OLED units or QLED units. The OLED device may be an active matrix organic light emitting diode (AMOLED) device or a passive matrix organic light emitting diode (PMOLED) device, which is not repeated in the embodiment of the present disclosure.

It will be easily appreciated by one skilled in the art that the to-be-packaged device 3 is shown in FIG. 2 and FIG. 5 to FIG. 7 for clearly describing the packaging structure 2. In practical applications, the to-be-packaged device 3 is covered by the first filler 24 and the second filler 26. Thus, although the first filler 24 and the second filler 26 can be seen, the to-be-packaged device 3 cannot be seen from FIG. 2 and FIG. 5 to FIG. 7. This is not limited in the embodiment of the present disclosure.

In summary, in the packaging structure provided by the embodiment of the present disclosure, as the plurality of sealed cavities enclosed by the first substrate, the second substrate and the plurality of first sealing frames in the packaging structure do not communicate with one another, the first filler in the plurality of sealed cavities would not affect one another. Thus, even if the filling of the first filler in a certain sealed cavity is uneven, the filling effect of the first filler in other sealed cavities will not be affected, which is beneficial in improving the overall filling effect of the filler, thereby improving the package effect of the packaging structure. Moreover, in the packaging structure provided in the embodiment of the present disclosure, the plurality of first sealing frames can help to extend the penetration paths of moisture and oxygen, which is beneficial in improving the barrier effect of the packaging structure against moisture and oxygen, thereby improving the package effect of the packaging structure.

The packaging structure provided in the embodiment of the present disclosure may be applied to the following packaging method. For the packaging method and principle in the embodiment of the present disclosure, reference can be made to descriptions in the following embodiments.

Figure 8:
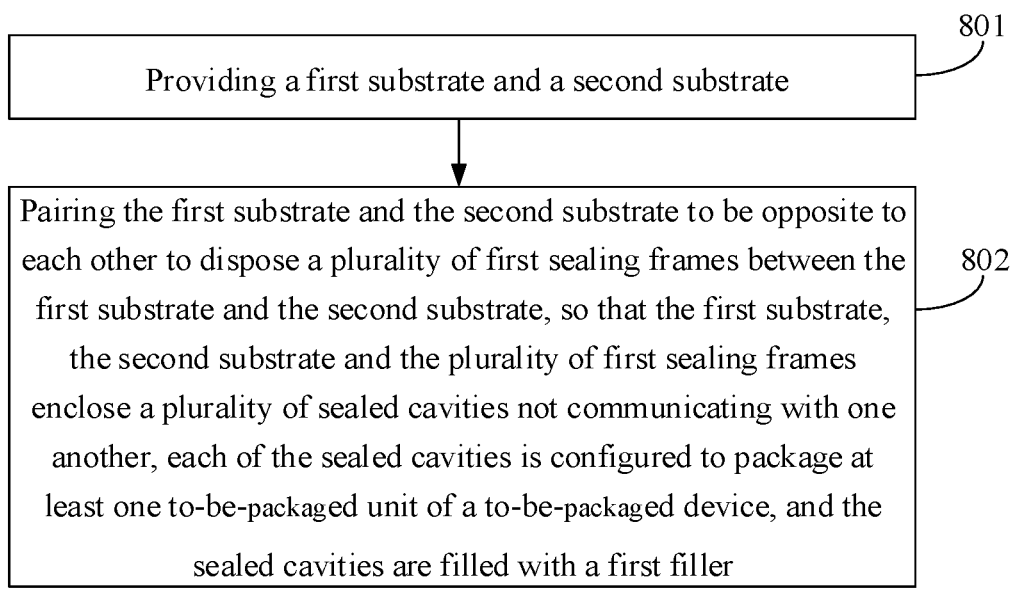
FIG. 8 is a method flowchart of a packaging method according to an embodiment of the present disclosure.

With reference to FIG. 8 which shows a method flowchart of a packaging method according to an embodiment of the present disclosure, the method is adopted to package a to-be-packaged device to obtain a packaging structure. With reference to FIG. 8, the packaging method may include following steps.

In step 801, a first substrate and a second substrate are provided.

In step 802, the first substrate and the second substrate are paired to be opposite to each other, to dispose a plurality of first sealing frames between the first substrate and the second substrate, so that the first substrate, the second substrate and the plurality of first sealing frames enclose a plurality of sealed cavities not communicating with one another, each of the sealed cavities is configured to package at least one to-be-packaged unit of a to-be-packaged device, and the sealed cavities are filled with a first filler.

In summary, in the packaging method provided by the embodiment of the present disclosure, as the plurality of sealed cavities enclosed by the first substrate, the second substrate and the plurality of first sealing frames in the packaging structure formed by the packaging method do not communicate with one another, the first filler in the plurality of sealed cavities would not affect one another. Thus, even if the filling of the first filler in a certain sealed cavity is uneven, the filling effect of the first filler in other sealed cavities will not be affected, which is beneficial in improving the overall filling effect of the filler, thereby improving the package effect of the packaging structure.

Optionally, the step 802 may include:

forming the plurality of first sealing frames on the first substrate, wherein a height of the first sealing frames is greater than or equal to a preset height;

forming a first filling adhesive on the first substrate at regions enclosed by the first sealing frames;

pairing the first substrate and the second substrate formed with the to-be-packaged device to be opposite to each other, so that the height of the first sealing frames is equal to a distance between the first substrate and the second substrate, and the plurality of first sealing frames, the first filling adhesive and the to-be-packaged device are located between the first substrate and the second substrate; and thus, the first substrate, the second substrate and the plurality of first sealing frames enclose the plurality of sealed cavities not communicating with one another, each of the sealed cavities is configured to package at least one to-be-packaged unit, and each of the sealed cavities is filled with the first filling adhesive; and curing the first filling adhesive to obtain the first filler.

Optionally, prior to pairing the first substrate and the second substrate formed with the to-be-packaged device to be opposite to each other, the method further includes:

forming a second sealing frame on the first substrate, wherein the plurality of first sealing frames are located in the second sealing frame;

forming a second filling adhesive on the first substrate at regions located between the second sealing frame and the first sealing frames.

Optionally, after pairing the first substrate and the second substrate formed with the to-be-packaged device to be opposite to each other, the method further includes:

curing the second filling adhesive to obtain a second filler.

Optionally, said forming the first filling adhesive on the first substrate at regions enclosed by the first sealing frames includes:

forming the first filling adhesive on the first substrate at regions enclosed by the first sealing frames by a dispensing process, and said forming the second filling adhesive on the first substrate at regions located between the second sealing frame and the first sealing frames includes:

forming the second filling adhesive on the first substrate at regions located between the second sealing frame and the first sealing frames by a dispensing process;

Here, an amount of one drop of the second filling adhesive is greater than an amount of one drop of the first filling adhesive.

Optionally, prior to forming the plurality of first sealing frames on the first substrate, the method further includes:

determining a number of packaged units to be packaged in a first sealing frame to be formed based on a dispersed area of one drop of the first filling adhesive; and determining an area of the first sealing frame to be formed based on the number of the packaged units to be packaged in the first sealing frame to be formed, said forming the plurality of first sealing frames on the first substrate includes:

forming the plurality of first sealing frames on the first substrate according to the area of the first sealing frame to be formed.

Optionally, said forming the plurality of first sealing frames on the first substrate includes:

forming the plurality of first sealing frames on the first substrate by using an elastic material.

All the aforesaid optional technical solutions may be combined arbitrarily to form optional embodiments of the present disclosure, and will not be repeated herein.

Figure 9:
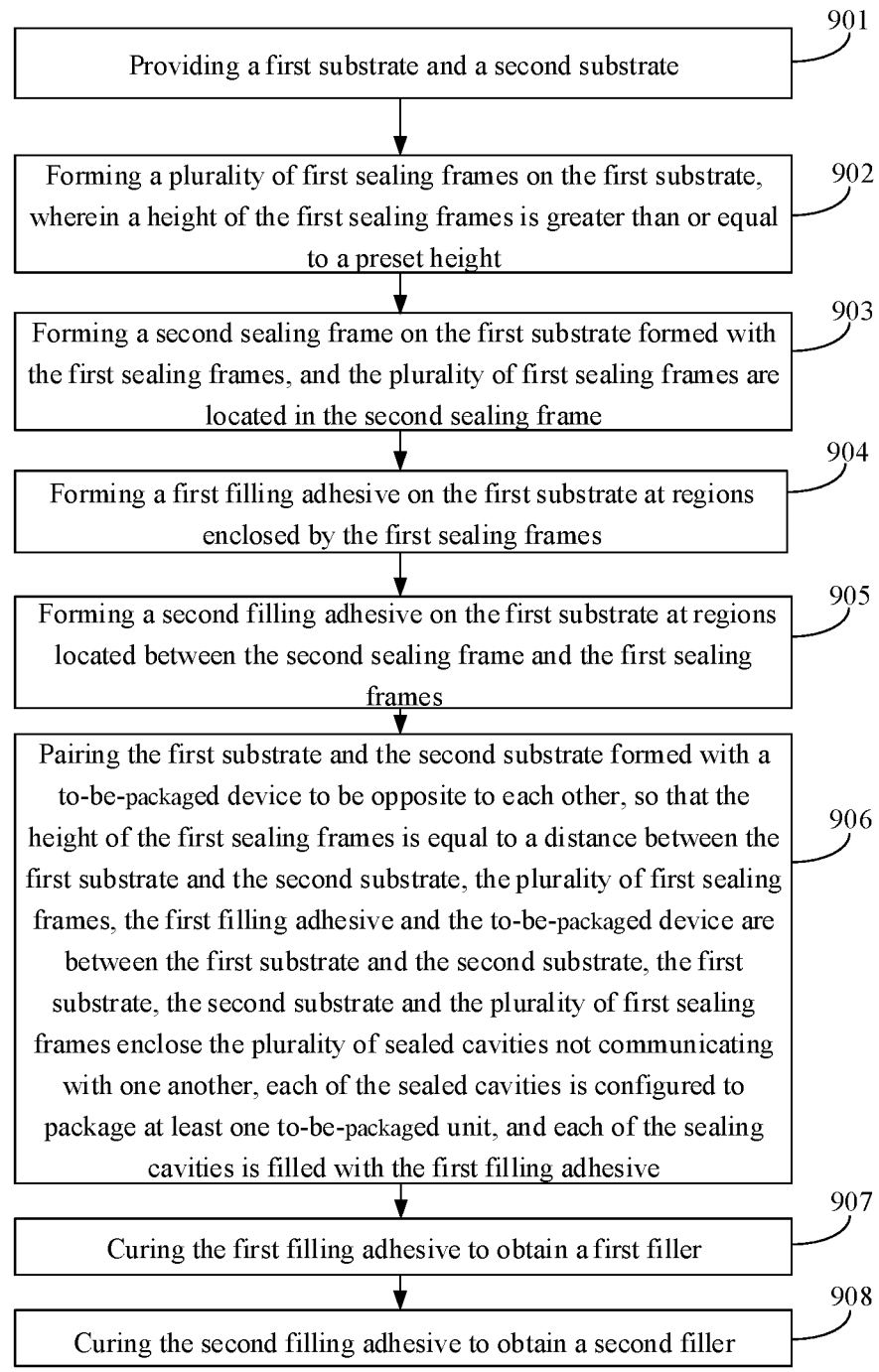
FIG. 9 is a method flowchart of another packaging method according to an embodiment of the present disclosure.

With reference to FIG. 9 which shows a method flowchart of another packaging method according to an embodiment of the present disclosure, the method is adopted to package a to-be-packaged device to obtain a packaging structure. The embodiment of the present disclosure takes the packaging structure 2 shown in FIG. 2 as an example for illustration. With reference to FIG. 9, the packaging method may include following steps:

In step 901, a first substrate and a second substrate are provided.

The first substrate may be a package cover plate, the second substrate may be a base substrate of the to-be-packaged device, and the first substrate and the second substrate may both be transparent substrates. For example, the first substrate and the second substrate may be rigid substrates made of light-guiding and non-metallic materials with a certain degree of robustness, such as glass, quartz, or transparent resin.

The to-be-packaged device may include a plurality of to-be-packaged units. The to-be-packaged device may be a display device, such as, an OLED device or a QLED device. Correspondingly, the to-be-packaged unit may be a light emitting unit, such as, an OLED unit or a QLED unit. When the to-be-packaged unit is a light emitting unit, the to-be-packaged device may further include a plurality of driving units corresponding to the plurality of to-be-packaged units in a one-to-one correspondence, and each of the driving units is electrically connected to a corresponding to-be-packaged unit and is configured to drive the corresponding to-be-packaged unit to emit light. The driving unit may be a switching unit, such as a TFT.

In step 902, a plurality of first sealing frames are formed on the first substrate, wherein a height of the first sealing frames is greater than or equal to a preset height.

Figure 10:
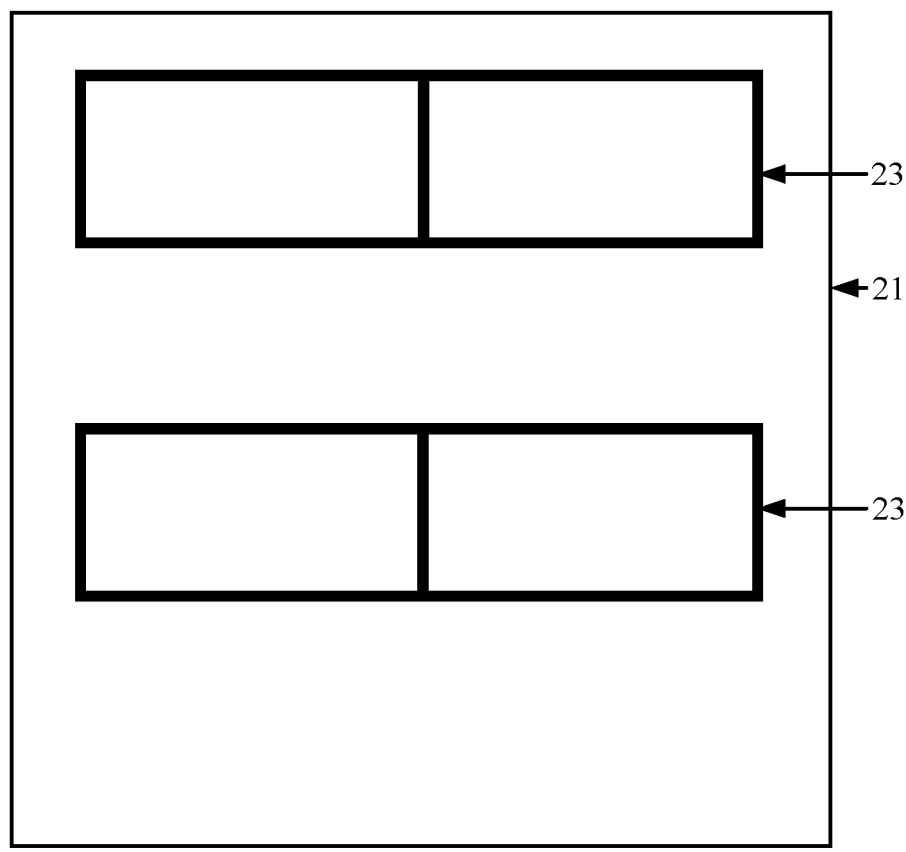
FIG. 10 is a schematic front view showing that first sealing frames have been formed on a first substrate according to an embodiment of the present disclosure.
Figure 11:
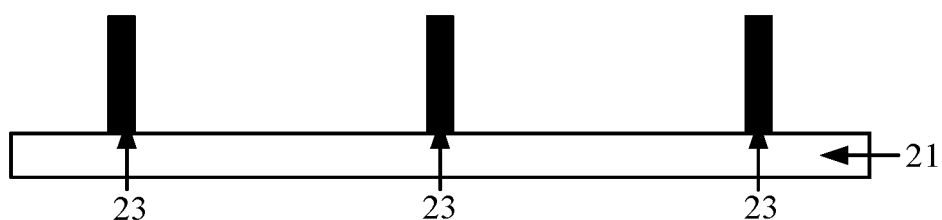
FIG. 11 is a schematic sectional view of FIG. 10.

Optionally, FIG. 10 is a schematic front view showing that the first sealing frames 23 have been formed on the first substrate 21 according to an embodiment of the present disclosure, and FIG. 11 is a schematic sectional view of FIG. 10. With reference to FIG. 10 and FIG. 11, a plurality of first sealing frames 23 (four are shown in FIG. 10) are arranged in arrays on the first substrate 21. Any two adjacent first sealing frames of the plurality of first sealing frames 23 located in a same row share a common frame edge, and as shown in FIG. 10, any two adjacent first sealing frames of the plurality of first sealing frames 23 located in the same row share a same common frame edge. Optionally, the first substrate 21 may have a display region (not marked in FIG. 10 and FIG. 11) and a non-display region (not marked in FIG. 10 and FIG. 11), and the plurality of first sealing frames 23 may be located in the display region of the first substrate 21. The display region of the first substrate 21 may correspond to the display region of the second substrate 22, and the non-display region of the first substrate 21 may correspond to the non-display region of the second substrate 22.

The material of the first sealing frames 23 may be an elastic material. For example, the material of the first sealing frames 23 may be elastic resin or TPE. The height of the first sealing frames 23 may be greater than or equal to a preset height which is set according to a distance between the first substrate and the second substrate in the conventional packaging structure. The height of the first sealing frames 23 may be the dimension of the first sealing frames 23 in a direction perpendicular to the plate surface of the first substrate 21.

Exemplarily, forming the plurality of first sealing frames 23 on the first substrate 21 may include steps of forming an elastic material layer on the first substrate 21 by any one of the chemical vapor deposition (CVD), coating, or sputtering process. The thickness of the elastic material layer is greater than or equal to the preset height, and the elastic material layer is processed by one patterning process to obtain the plurality of first sealing frames 23. Alternatively, the plurality of first sealing frames 23 may be formed on the first substrate 21 by an ink-jet printing (IJP) process or a coating process, which is not limited in the embodiment of the present disclosure.

Optionally, as shown in FIG. 2, each of the first sealing frames 23 has a first filler 24 and at least one to-be-packaged unit 31. The first filler 24 may be obtained by forming the first filling adhesive in the first sealing frame 23 by a dispensing process and then curing the first filling adhesive. The area of the first sealing frame 23 may be determined before the step 902, so that the plurality of first sealing frames 23 can be formed on the first substrate according to the determined area of the first sealing frame 23. Exemplarily, determining the area of the first sealing frame 23 may include: determining the number of the packaged units 31 to be packaged in the first sealing frame 23 to be formed based on the dispersed area of one drop of the first filling adhesive, and determining the area of the first sealing frame 23 to be formed based on the number of the packaged units 31 to be packaged in the first sealing frame 23 to be formed. The dispersed area of one drop of the first filling adhesive represents a dispersed area of one drop of the first filling adhesive after being dispersed on the plane, and is generally greater than the area of one to-be-packaged unit 31 (such as a light emitting unit). In the embodiment of the present disclosure, the first filling adhesive needs to be dispensed in the first sealing frame 23, thus, the area of the first sealing frame 23 is at least larger than the dispersed area of one drop of the first filling adhesive, which can facilitate the dispensing of the first filling adhesive in the first sealing frame 23. Exemplarily, the dispersed area of one drop of the first filling adhesive may be 1 square millimeter or 1.5 square millimeters, etc., and the area of the to-be-packaged unit 31 may be an area of the orthographic projection of the to-be-packaged unit 31 onto the second substrate 22. The area of the first sealing frame 23 refers to the area of the closed region enclosed by the first sealing frame 23. Optionally, determining the number of the packaged units 31 to be packaged in the first sealing frame 23 to be formed based on the dispersed area of one drop of the first filling adhesive may include: determining the number of drops of the first filling adhesive to be dispensed in the first sealing frame 23 to be formed and the area of one to-be-packaged unit; determining a total dispersed area of the first filling adhesive to be dispensed in the first sealing frame 23 based on the number of drops of the first filling adhesive to be dispensed in the first sealing frame 23 and the dispersed area of one drop of the first filling adhesive; and determining a ratio of the total dispersed area to the area of one to-be-packaged unit as the number of the to-be-packaged units 31 in one first sealing frame 23 to be formed. Alternatively, the number of the to-be-packaged units 31 being covered by one drop of the first filling adhesive that is dispersed may be determined based on the dispersed area of one drop of first filling adhesive, and the number of to-be-packaged units 31 in the first sealing frame 23 to be formed may be determined to be equal to an integer multiple of the number of the to-bepackaged units 31 being covered by one drop of the first filling adhesive that is dispersed.

In step 903, a second sealing frame is formed on the first substrate formed with the first sealing frames, and the plurality of first sealing frames are located in the second sealing frame.

Figure 12:
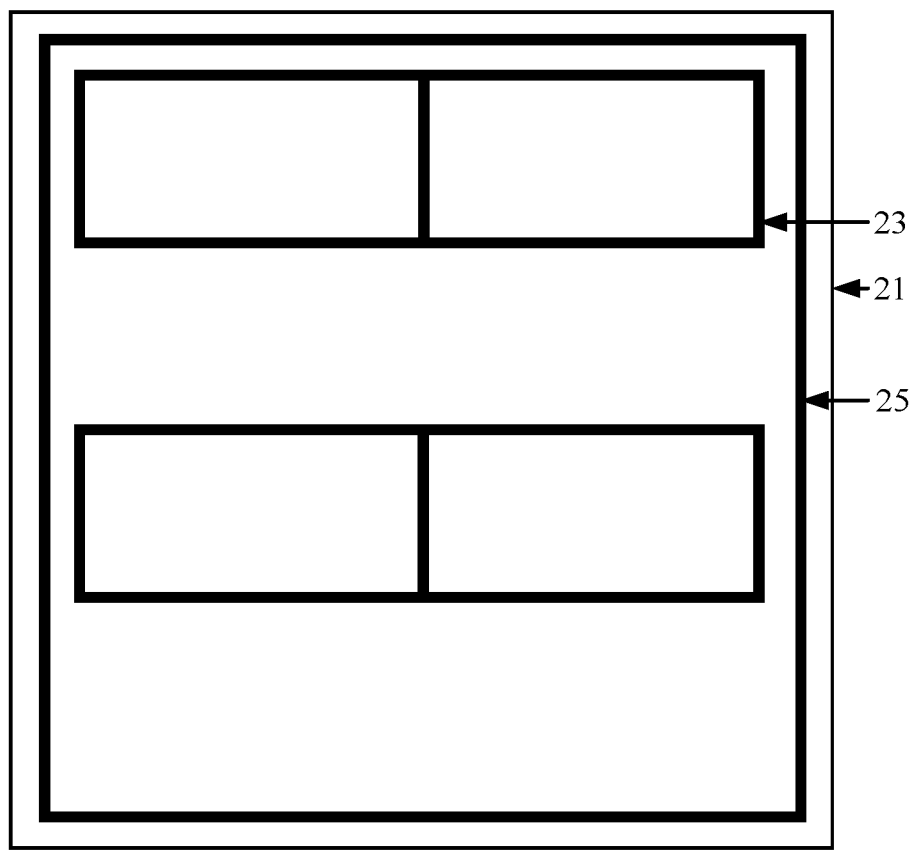
FIG. 12 is a schematic front view showing that a second sealing frame has been formed on a first substrate on which the first sealing frames have been formed according to an embodiment of the present disclosure.
Figure 13:
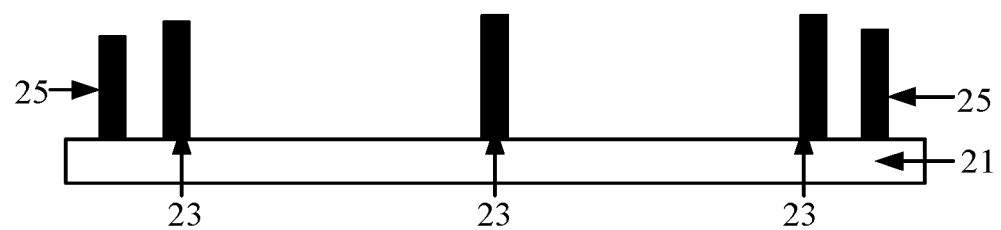
FIG. 13 is a schematic sectional view of FIG. 12.

Optionally, FIG. 12 is a schematic front view showing that the second sealing frame 25 has been formed on the first substrate 21 on which the first sealing frames 23 have been formed according to an embodiment of the present disclosure, and FIG. 13 is a schematic sectional view of FIG. 12. With reference to FIG. 12 and FIG. 13, the second sealing frame 25 may be located in the non-display region of the first substrate 21, and the plurality of first sealing frames 23 may be located in the second sealing frame 25, the non-display region generally being located at the periphery of the first substrate 21. Optionally, a height of the second sealing frame 25 may be less than or equal to the height of the first sealing frames 23. For example, the height of the second sealing frame 25 may be equal to the aforesaid preset height.

The material of the second sealing frame 25 may be a frame sealing adhesive. Exemplarily, any one of the CVD, coating, or sputtering process may be adopted to form a layer of the frame sealing adhesive material on the first substrate 21 formed with the first sealing frame 23, and the layer of the frame sealing adhesive material may be processed by one patterning process to obtain the second sealing frame 25. Alternatively, the second sealing frame 25 may be formed on the first substrate 21 formed with the first sealing frames 23 by an IJP process or coating process, which is not limited in the embodiment of the present disclosure.

In step 904, the first filling adhesive is formed on the first substrate at regions enclosed by the first sealing frames.

Figure 14:
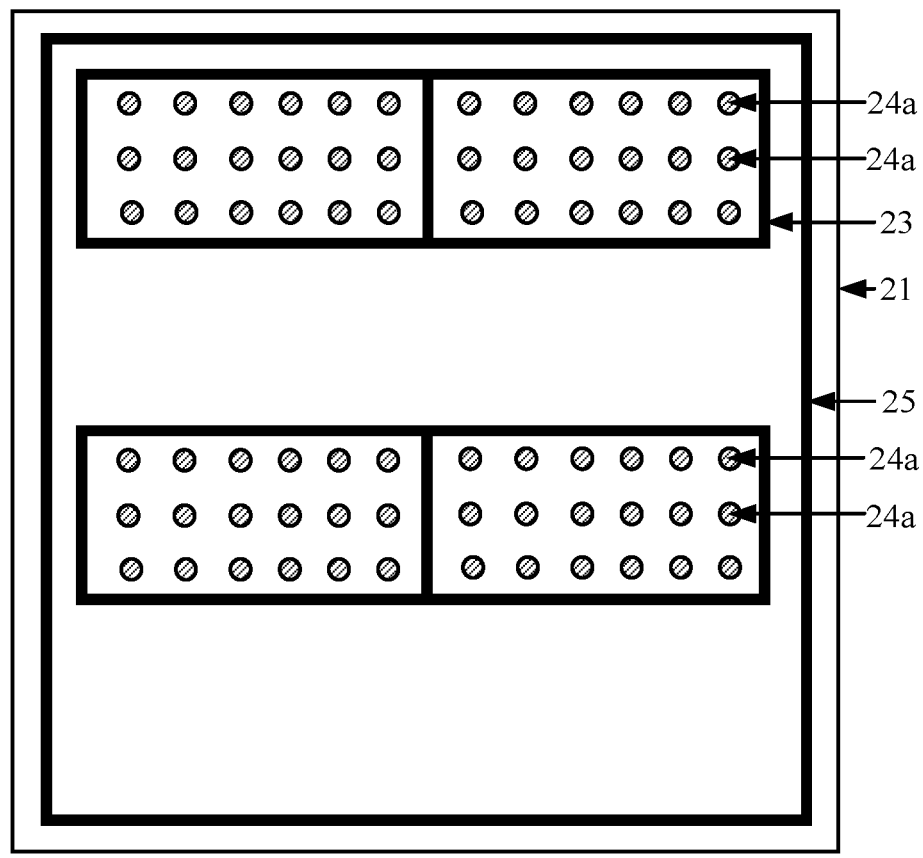
FIG. 14 is a schematic front view showing that a first filling adhesive has been formed on the first substrate at regions enclosed by the first sealing frames according to an embodiment of the present disclosure.
Figure 15:
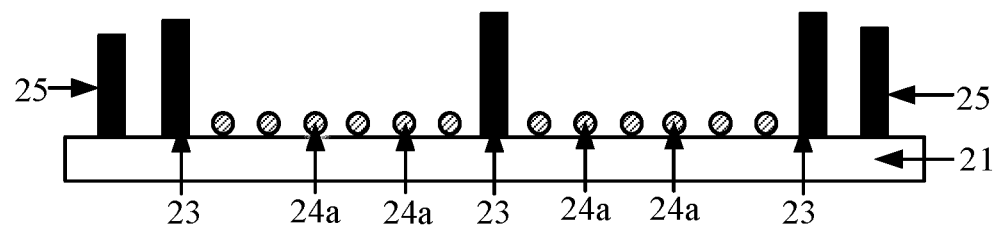
FIG. 15 is a schematic sectional view of FIG. 14.

Optionally, the first filling adhesive is formed on the first substrate at regions enclosed by the first sealing frames by a dispensing process. FIG. 14 is a schematic front view showing that the first filling adhesive 24a has been formed on the first substrate 21 at regions enclosed by the first sealing frames 23 according to an embodiment of the present disclosure, and FIG. 15 is a schematic sectional view of FIG. 14. With reference to FIG. 14 and FIG. 15, each of the first sealing frames 23 has a plurality of drops of first filling adhesive 24a that are evenly distributed.

It will be easily appreciated by one skilled in the art that FIG. 14 and FIG. 15 are only exemplary. In the embodiment of the present disclosure, the dispersed area of one drop of the first filling adhesive is generally greater than the area of one packaged unit to be packaged. Thus, the number of drops of the first filling adhesive 24a in each of the first sealing frames 23 is generally smaller than the number of the packaged units 31 to be packaged in the first sealing frame 23. Exemplarily, as shown in FIG. 2 to FIG. 7, each of the first sealing frames 23 may have three to-be-packaged units 31. Thus, the number of drops of the first filling adhesive 24a in each of the first sealing frames 23 may be less than 3. For the sake of clarity, a plurality of drops of the first filling adhesive 24a are drawn in each of the first sealing frames 23 of FIG. 14 and FIG. 15. Optionally, the number of drops of the first filling adhesive 24a in each of the first sealing frames 23 may also be greater than or equal to the number of the packaged units 31 to be packaged in the first sealing frame 23, which is not limited in the embodiment of the present disclosure.

In step 905, a second filling adhesive is formed on the first substrate at regions located between the second sealing frame and the first sealing frames.

Figure 16:
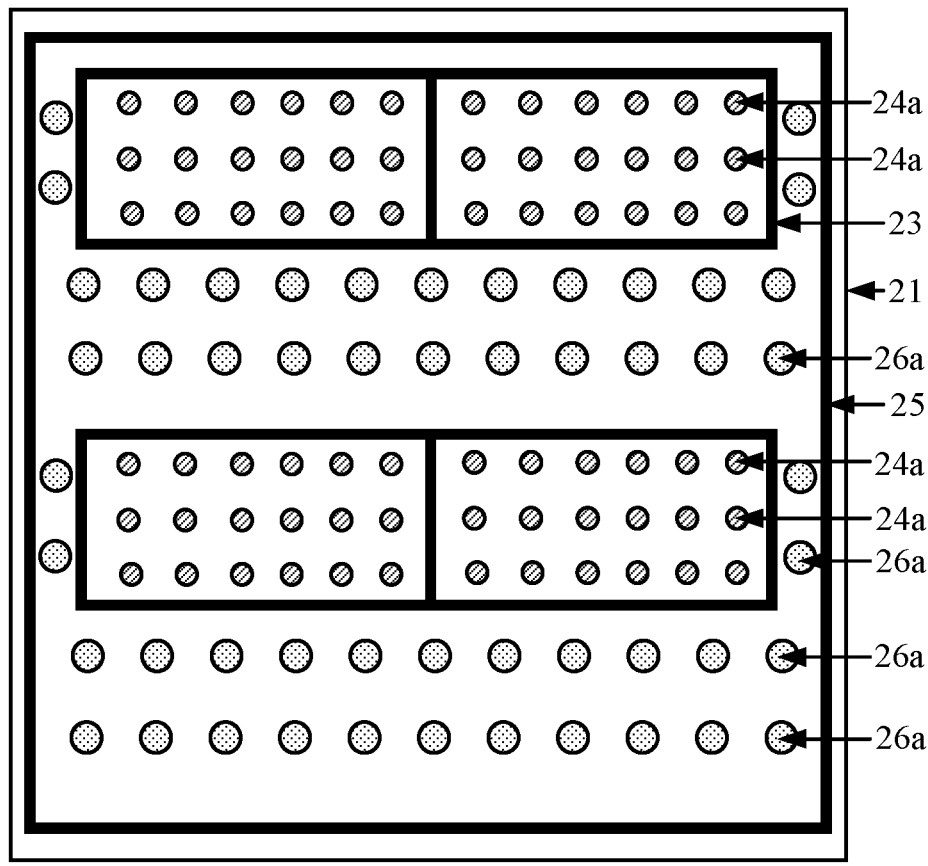
FIG. 16 is a schematic front view showing that a second filling adhesive has been formed on the first substrate at regions located between the second sealing frame and the first sealing frames according to an embodiment of the present disclosure.
Figure 17:
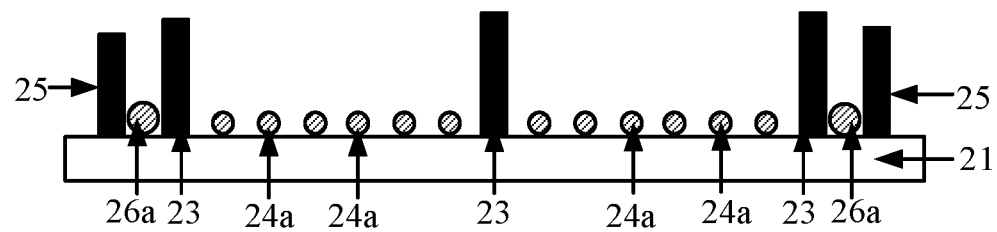
FIG. 17 is a schematic sectional view of FIG. 16.

Optionally, the second filling adhesive may be formed on the first substrate at regions located between the second sealing frame and the first sealing frames by a dispensing process. FIG. 16 is a schematic front view showing that the second filling adhesive 26a has been formed on the first substrate 21 at regions located between the second sealing frame 25 and the first sealing frames 23 according to an embodiment of the present disclosure, and FIG. 17 is a schematic sectional view of FIG. 16. With reference to FIG. 16 and FIG. 17, the second filling adhesive 26a is located at regions between the second sealing frame 25 and the first sealing frames 23. That is, the second filling adhesive 26a is located inside the second sealing frame 25 and outside the first sealing frames 23.

In the embodiment of the present disclosure, the first filling adhesive 24a and the second filling adhesive 26a may be formed by the dispensing process, and an amount of one drop of the second filling adhesive 26a may be greater than an amount of one drop of the first filling adhesive 24a. As shown in FIG. 2 to FIG. 7, the first filling adhesive 24a is cured to form the first filler 24, and the second filling adhesive 26a is cured to form the second filler 26. The first filler 24 may package the to-be-packaged units 31 (such as light emitting units) and the driving units 32, and the second filler 26 may package the structures of the to-be-packaged device 3 other than the to-be-packaged units 31. Thus, the packaging structure 2 has a higher filling requirement (such as the packaging uniformity) on the first filler 24 than the second filler 26, and when the amount of one drop of the second filling adhesive 26a is greater than the amount of one drop of the first filling adhesive 24a, the first filling adhesive 24a can hence have a higher dispensing accuracy than the second filling adhesive 26a, so that the filling uniformity of the package of the first filler 24 can be higher than the filling uniformity of the second filler 26, thereby decreasing the difficulty of the dispensing process while increasing the dispensing efficiency.

In step 906, the first substrate and the second substrate formed with the to-be-packaged device are paired to be opposite to each other, so that the height of the first sealing frames is equal to a distance between the first substrate and the second substrate, the plurality of first sealing frames, the first filling adhesive and the to-be-packaged device are between the first substrate and the second substrate, the first substrate, the second substrate and the plurality of first sealing frames enclose the plurality of sealed cavities not communicating with one another, each of the sealed cavities is configured to package at least one to-be-packaged unit, and each of the sealed cavities is filled with the first filling adhesive.

For the schematic diagram after pairing the first substrate 21 and the second substrate 22 formed with the to-be-packaged device 3 to be opposite to each other, reference can be made to the FIG. 2 to FIG. 4. Exemplarily, firstly, a surface of the first substrate formed with the first sealing frames 23, the second sealing frame 25, the first filling adhesive 24a and the second filling adhesive 26a and a surface of the second substrate 22 formed with the to-be-packaged device 3 are arranged as facing each other. Then, the first substrate 21 and the second substrate 22 are aligned, so that the first sealing frames 23, the second sealing frame 25, the first filling adhesive 24a, the second filling adhesive 26a and the to-be-packaged device 3 are between the first substrate 21 and the second substrate 22, and each of the first sealing frames 23 is provided with at least one to-be-packaged unit 31. Afterwards, a pressure is applied to the first substrate 21 and/or the second substrate 22 to make the height of the first sealing frame 23 equal to the distance between the first substrate 21 and the second substrate 22, so that the first substrate 21, the second substrate 22 and the plurality of first sealing frames 23 enclose the plurality of sealed cavities not communicating with one another, at least one to-be-packaged unit is packaged in each of the sealed cavities, and each of the sealed cavities is filled with the first filling adhesive 24a.

In step 907, the first filling adhesive is cured to obtain the first filler.

Reference can be made to FIG. 2 to FIG. 4 for the schematic diagram after curing the first filling adhesive 24a to obtain the first filler 24. Optionally, when the first filling adhesive 24a is a light curing epoxy resin, the ultraviolet light may be adopted to irradiate the first substrate 21 and/or the second substrate 22, so that the ultraviolet light passes through the first substrate 21 and/or the second substrate 22 to irradiate the first filling adhesive 24a, thereby curing the first filling adhesive 24a under the action of the ultraviolet light to obtain the first filler 24. Alternatively, when the first filling adhesive 24a is a thermal curing epoxy resin, the first filling adhesive 24a may be heated and baked, and thus be cured under the action of temperature to obtain the first filler 24.

In step 908, the second filling adhesive is cured to obtain the second filler.

Reference can be made to FIG. 2 to FIG. 4 for the schematic diagram after curing the second filling adhesive 26a to obtain the second filler 26. Optionally, when the second filling adhesive 26a is a light curing epoxy resin, the ultraviolet light may be adopted to irradiate the first substrate 21 and/or the second substrate 22, so that the ultraviolet light passes through the first substrate 21 and/or the second substrate 22 to irradiate the second filling adhesive 26a, thereby curing the second filling adhesive 26a under the action of the ultraviolet light to obtain the second filler 26. Alternatively, when the second filling adhesive 26a is a thermal curing epoxy resin, the second filling adhesive 26a may be heated and baked, and thus be cured under the action of temperature to obtain the second filler 26.

In the packaging method provided by the embodiment of the present disclosure, one patterning process as involved may include photoresist coating, exposure, development, etching, and photoresist stripping. Treating a material layer (such as the elastic material layer) by one patterning process to obtain a corresponding structure (such as the first sealing frames 23) includes: first, coating a layer of photoresist on the material layer (such as the elastic material layer) to form a photoresist layer, and exposing the photoresist layer with a mask plate, so that the photoresist layer forms a fully exposed region and a non-exposed region; then, completely removing the photoresist in the fully exposed region and completely retaining the photoresist in the non-exposed region by a development process; afterwards, etching the region corresponding to the fully exposed region on the material layer (such as the elastic material layer) by an etching process; and finally, stripping the photoresist in the non-exposure region to obtain the corresponding structure (such as the first sealing frames 23). It will be easily appreciated that this paragraph takes a positive photoresist as an example for illustration. When the photoresist is negative, the illustration in this paragraph only functions as a reference for the process of one patterning process, and will not be repeated herein.

It will be easily appreciated by one skilled in the art that the sequence of steps of the packaging method according to the embodiment of the present disclosure can be appropriately adjusted, and the steps can also be correspondingly added or deleted according to the situation. For example, the steps 907 and 908 may be adjusted or executed simultaneously. Any modified method that can be easily conceived by any one skilled in the art within the technical scope disclosed in the present disclosure shall be contained within the protection scope of the present disclosure, and therefore will not be described again.

In summary, in the packaging method provided by the embodiment of the present disclosure, as the plurality of sealed cavities enclosed by the first substrate, the second substrate and the plurality of first sealing frames in the packaging structure formed by the packaging method would not communicate with one another, the first filler in the plurality of sealed cavities would not affect one another. Thus, even if the filling of the first filler in a certain sealed cavity is uneven, the filling effect of the first filler in other sealed cavities will not be affected, which is beneficial in improving the overall filling effect of the filler, thereby improving the package effect of the packaging structure. Moreover, in the packaging structure provided in the embodiment of the present disclosure, the plurality of first sealing frames may help to extend the penetration paths of moisture and oxygen, which is beneficial in improving the barrier effect of the packaging structure against moisture and oxygen, thereby improving the package effect of the packaging structure.

Based on the same concept, the embodiment of the present disclosure provides a display apparatus, which includes a display device and the packaging structure 2 provided by the aforesaid embodiments. The to-be-packaged device 3 in the aforesaid embodiments may be the display device, and the to-be-packaged units 31 may be the light emitting units of the display device. It will be easily appreciated that the display apparatus of the embodiment of the present disclosure may be obtained by replacing the to-be-packaged device 3 in FIG. 2 to FIG. 7 with a display device. That is, when the to-be-packaged device 3 in FIG. 2 to FIG. 7 is a display device, FIG. 2 to FIG. 7 are also schematic diagrams of the display apparatus, which is not limited in the embodiment of the present disclosure.

Optionally, in the display apparatus, each of the sealed cavities of the packaging structure 2 packages a plurality of light emitting units therein, and the plurality of light emitting units packaged in a same sealed cavity may include a red light emitting unit, a green light emitting unit, and a blue light emitting unit. The red light emitting unit is configured to emit red light, the green light emitting unit is configured to emit green light, and the blue light emitting unit is configured to emit blue light.

In the embodiment of the present disclosure, as the plurality of sealed cavities of the packaging structure do not communication with one another, the light emitting units packaged in the plurality of sealed cavities would not affect one another. Even if a light emitting unit packaged in a certain sealed cavity has a poor luminescence uniformity, the luminescence uniformity of the light emitting units packaged in other sealed cavities would not be affected, which is beneficial in improving the overall luminescence uniformity of the display apparatus, thereby alleviating the problems of light leakage and color shift of the display apparatus.

Optionally, the display device further includes a driving unit electrically connected to the light emitting units, and the driving unit is configured to drive the light emitting units to emit light and is located in the second sealing frame 25 of the packaging structure 2. As shown in FIG. 2 to FIG. 4, the driving units 32 are located inside the second sealing frame 25 and outside the first sealing frames 23, and the second filler 26 covers the driving units 32. Alternatively, as shown in FIG. 5 to FIG. 7, the driving units 32 are located inside the second sealing frame 25 and also inside each first sealing frame 23, and the first filler 24 covers the driving units 32. Exemplarily, the display device includes a plurality of driving units electrically connected to the plurality of light emitting units in a one-to-one correspondence. Each of the driving units is configured to drive the corresponding light emitting unit to emit light, and the driving unit may be a switching unit, such as a TFT.

Optionally, the display apparatus may be an EL display apparatus. Exemplarily, the display apparatus may be any of a large-size OLED display apparatus or a large-size QLED display apparatus. Correspondingly, the display device may be any of a large-size OLED display device or a large-size QLED display device, and the light emitting unit may be any of an OLED unit or a QLED unit. The OLED display apparatus may be an AMOLED display apparatus or a PMOLED display apparatus, which is not limited in the embodiment of the present disclosure.

Optionally, the display apparatus may be any product or component having a display function, such as electronic paper, a mobile phone, a tablet computer, a TV set, a display, a notebook computer, a digital photo frame, a navigator, a wearable apparatus or a virtual display apparatus, and the like.

In the display apparatus, reference can be made to the aforesaid embodiments for the detailed descriptions of the packaging structure 2, which will not be repeated in the embodiment of the present disclosure.

In the embodiments of the present disclosure, the term "electrically connected" indicates a connection that is capable of transferring charge, but not necessarily includes charge transfer. For example, if A is electrically connected to B, it indicates that A is connected to B and charges can be transferred between A and B, whereas the charge transfer does not necessarily occur between A and B. The term "at least one" indicates one or more in number, and "a plurality of" indicates two or more in number, unless otherwise defined. The terms such as "first", "second" and "third" are merely for a descriptive purpose, and cannot be understood as indicating or implying a relative importance. The term "and/or" merely describes the association relationship between the associated objects and indicates that there may be three relationships; for example, C and/or D may indicate three cases where only C exists, C and D exist at the same time, and only D exists.

Other embodiments of the present disclosure will be apparent to one skilled in the art from consideration of the specification and practice of the present disclosure. The present disclosure is intended to cover any variations, uses, or adaptations of the present disclosure following the general principles thereof and including common knowledge or commonly used technical measures in the art which are not disclosed herein. The specification and embodiments are to be considered as exemplary only, and the true scope and spirit of the present disclosure are indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure is only limited by the appended claims.

What is claimed is:

1. A packaging structure, comprising:
a first substrate and a second substrate opposite to each other;
a plurality of first sealing frames between the first substrate and the second substrate, wherein the first substrate, the second substrate and the plurality of first sealing frames enclose a plurality of sealed cavities not communicating with one another, and each of the sealed cavities is configured to package at least one to-be-packaged unit of a to-be-packaged device;
a first filler in the sealed cavities, wherein the first filler is obtained by curing a first filling adhesive by a dispensing process;
a second sealing frame between the first substrate and the second substrate, wherein the plurality of first sealing frames are located inside the second sealing frame; and
a second filler between the second sealing frame and the first sealing frames, wherein the second filler is obtained by curing a second filling adhesive by a dispensing process;
wherein an amount of one drop of the second filling adhesive is greater than an amount of one drop of the first filling adhesive.

2. The packaging structure according to claim 1, wherein the plurality of first sealing frames are arranged in arrays to form a plurality of rows, and any two adjacent first sealing frames located in a same row share a common frame edge.

3. The packaging structure according to claim 1, wherein the plurality of first sealing frames are arranged in arrays to form a plurality of columns, and any two adjacent first sealing frames located in a same column share a common frame edge.

4. The packaging structure according to claim 1, wherein any two adjacent first sealing frames of the plurality of first sealing frames share a common frame edge.

5. The packaging structure according to claim 1, wherein the plurality of first sealing frames are spaced apart from one another.

6. The packaging structure according to claim 1, wherein a material of the first sealing frames is an elastic material.

7. The packaging structure according to claim 1, wherein the first substrate has a display region and a non-display region, the first sealing frames are located in the display region and the second sealing frame is located in the non-display region.

8. The packaging structure according to claim 1, wherein the to-be-packaged unit is a light emitting unit, each of the sealed cavities is configured to package a plurality of to-be-packaged units of the to-be-packaged device, and the plurality of to-be-packaged units packaged in a same sealed cavity emit light with different colors.

9. A packaging method, comprising:
providing a first substrate and a second substrate;
forming a plurality of first sealing frames on the first substrate, wherein a height of each first sealing frame is greater than or equal to a preset height;
forming a first filling adhesive on the first substrate at regions enclosed by the first sealing frames by a dispensing process;
forming a second sealing frame on the first substrate, wherein the plurality of first sealing frames are located in the second sealing frame; and
forming a second filling adhesive on the first substrate at regions located between the second sealing frame and the first sealing frames by a dispensing process, wherein an amount of one drop of the second filling adhesive is greater than an amount of one drop of the first filling adhesive;

pairing the first substrate and the second substrate formed with to-be-packaged devices to be opposite to each other, so that the height of each first sealing frame is equal to a distance between the first substrate and the second substrate, the plurality of first sealing frames, the first filling adhesive and the to-be-packaged devices are located between the first substrate and the second substrate, the first substrate, the second substrate and the plurality of first sealing frames enclose a plurality of sealed cavities not communicating with one another, each of the sealed cavities is configured to package at least one to-be-packaged unit, and each of the sealed cavities is filled with the first filling adhesive;

curing the first filling adhesive to obtain a first filler; and
curing the second filling adhesive to obtain a second filler.

10. The method according to claim 9, wherein
prior to forming the plurality of first sealing frames on the first substrate, the method further comprises:
determining a number of packaged units to be packaged in a first sealing frame to be formed according to a dispersed area of one drop of the first filling adhesive; and
determining an area of the first sealing frame to be formed according to the number of the packaged units to be packaged in the first sealing frame to be formed;
said forming the plurality of first sealing frames on the first substrate comprises:
forming the plurality of first sealing frames on the first substrate according to the area of the first sealing frame to be formed.

11. The method according to claim 7, wherein
said forming the plurality of first sealing frames on the first substrate comprises:
forming the plurality of first sealing frames on the first substrate by using an elastic material.

12. A display apparatus, comprising:
a display device, and a packaging structure, wherein the packaging structure comprises:
a first substrate and a second substrate opposite to each other;
a plurality of first sealing frames between the first substrate and the second substrate, wherein the first substrate, the second substrate and the plurality of first sealing frames enclose a plurality of sealed cavities not communicating with one another, and each of the sealed cavities is configured to package at least one to-be-packaged unit of a to-be-packaged device;
a first filler in the sealed cavities, wherein the first filler is obtained by curing a first filling adhesive by a dispensing process;
a second sealing frame between the first substrate and the second substrate, wherein the plurality of first sealing frames are located inside the second sealing frame; and
a second filler between the second sealing frame and the first sealing frames, wherein the second filler is obtained by curing a second filling adhesive by a dispensing process;
wherein an amount of one drop of the second filling adhesive is greater than an amount of one drop of the first filling adhesive.

13. The display apparatus according to claim 12, wherein
the packaged unit to be packaged is a light emitting unit of the display device, each of the sealed cavities packages a plurality of light emitting units of the display device, and the plurality of light emitting units packaged in a same sealed cavity comprise a red light emitting unit, a green light emitting unit, and a blue light emitting unit.

14. The display apparatus according to claim 13, wherein
the display device further comprises a driving unit electrically connected to the light emitting units; and
the packaging structure further comprises the second sealing frame between the first substrate and the second substrate, and the plurality of first sealing frames and the driving unit are located in the second sealing frame.

15. The display apparatus according to claim 13, wherein
the display device is an organic light emitting diode OLED device or a quantum dot light emitting diode QLED device; and
correspondingly, the light emitting unit is an OLED unit or a QLED unit.

\* \* \* \* \*